United States Patent
Lu et al.

(10) Patent No.: US 7,332,361 B2
(45) Date of Patent: Feb. 19, 2008

(54) XEROGRAPHIC MICRO-ASSEMBLER

(75) Inventors: Jeng Ping Lu, San Jose, CA (US);
Eugene M. Chow, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 412 days.

(21) Appl. No.: 11/011,652

(22) Filed: Dec. 14, 2004

(65) Prior Publication Data

US 2006/0128057 A1  Jun. 15, 2006

(51) Int. Cl.
  *G01R 31/26* (2006.01)
  *H01L 21/66* (2006.01)
(52) U.S. Cl. ............... 438/14; 438/51; 438/106; 257/E33.056; 257/E27.001
(58) Field of Classification Search ......... 438/106, 438/14
  See application file for complete search history.

(56) References Cited

U.S. PATENT DOCUMENTS

| | | | |
|---|---|---|---|
| 3,439,416 A | | 4/1969 | Yando |
| 3,660,760 A | * | 5/1972 | Schaad et al. ............ 455/41.1 |
| 4,194,668 A | | 3/1980 | Akyurek |
| 4,542,397 A | | 9/1985 | Biegelsen et al. |
| 5,034,802 A | | 7/1991 | Liebes et al. |
| 5,355,577 A | | 10/1994 | Cohn |
| 5,545,291 A | | 8/1996 | Smith et al. |
| 5,824,186 A | | 10/1998 | Smith et al. |
| 5,904,545 A | | 5/1999 | Smith et al. |
| 6,796,867 B2 | | 9/2004 | George et al. |
| 6,847,907 B1 | * | 1/2005 | Novotny ..................... 702/84 |
| 7,035,575 B2 | * | 4/2006 | Ikeguchi et al. ........... 399/267 |
| 2003/0165349 A1 | * | 9/2003 | Nakazawa .................. 399/384 |
| 2004/0229044 A1 | * | 11/2004 | Goto .......................... 428/421 |
| 2004/0244915 A1 | * | 12/2004 | Lam et al. .................. 156/510 |
| 2006/0057293 A1 | * | 3/2006 | Sharma et al. ........... 427/372.2 |
| 2006/0073632 A1 | * | 4/2006 | Garcia ........................ 438/106 |

* cited by examiner

*Primary Examiner*—Michael Lebentritt
*Assistant Examiner*—Abdulfattah Mustapha
(74) *Attorney, Agent, or Firm*—Marger Johnson & McCollom, P.C.

(57) ABSTRACT

Xerographic micro-assembler systems and methods are disclosed. The systems and methods involve manipulating charge-encoded micro-objects. The charge encoding identifies each micro-object and specifies its orientation for sorting. The micro-objects are sorted in a sorting unit so that they have defined positions and orientations. The sorting unit has the capability of electrostatically and magnetically manipulating the micro-objects based on their select charge encoding. The sorted micro-objects are provided to an image transfer unit. The image transfer unit is adapted to receive the sorted micro-objects, maintain them in their sorted order and orientation, and deliver them to a substrate. Maintaining the sorted order as the micro-objects are delivered to the substrate may be accomplished through the use of an electrostatic image, as is done in xerography. The substrate with the micro-objects is further processed to interconnect the micro-objects—through electrical wiring, for example—to form the final micro-assembly.

23 Claims, 11 Drawing Sheets

XEROGRAPHIC MICRO-ASSEMBLER

FIELD OF THE INVENTION

The field of the invention relates to micro-assembler systems and methods for forming micro-assemblies from micro-objects.

BACKGROUND OF THE INVENTION

The background of the invention relates to aspects of xerography as well as micro-assembly techniques used for fabricating microstructures and microdevices, generally referred to herein as "micro-assemblies."

The invention described below utilizes xerographic techniques as well as micro-assembly fabrication techniques. Accordingly, background information on xerography and micro-assembly fabrication techniques is provided below.

Xerography

In xerography (also known as electrophotography, electrostatographic printing, and colloquially as "photocopying"), a uniform electrostatic charge is placed upon a photoreceptor surface. The charged surface is then exposed to a light image of an original object to selectively dissipate the charge to form a latent electrostatic image of the original. The image is developed by depositing finely divided and charged particles of toner upon the photoreceptor surface. The charged toner is electrostatically attracted to the electrostatic image to create a visible replica of the original. The developed image is then transferred from the photoreceptor surface to a final substrate (e.g., paper). The toner image is then fixed ("fused") to the substrate to form a permanent replica ("photocopy") of the original object.

Micro-assembly Fabrication

There are several different approaches to fabricating micro-assemblies. One approach, which is used to fabricate MEMS micro-assemblies, is referred to as "micromachining." Micromachining utilizes standard semiconductor fabrication techniques (e.g., photolithographic patterning, isotropic/anisotropic etching, planarization, etc.). For example, digital light processors (DLPs) can be readily formed using surface-type micromachining, while pressure sensors and ink-jet printer heads typically use bulk micromachining. Other techniques, such as laser micromachining, wafer bonding, etc., may be combined with standard semiconductor fabrication techniques to enable the fabrication of advanced micro-assemblies, and in particular micro-electromechanical systems (MEMS), via micromachining.

Another technique used to fabricate micro-assemblies involves micro-assembling. Micro-assembling involves arranging very small (e.g., micron-scale) objects with a high degree of precision. One micro-assembling technique is referred to in the art as fluidic self-assembly (FSA). In FSA, devices ("function blocks") ranging in size from 10 microns to several hundred microns and having given shapes are suspended into a liquid to form a slurry. The slurry is poured over the surface of a substrate having recessed portions therein. The recessed portions are sized to match the function blocks. In this manner, the function blocks that have been dispersed in the liquid self-align and engage the recessed portions and become integral with the substrate. Examples of FSA technology are disclosed in U.S. Pat. Nos. 5,545,291, 5,783,856, 5,824,186 and 5,904,545.

Other micro-assembly fabrication approaches

Other approaches for fabricating individual electronic components (or generally microstructures) and assembling such structures onto a substrate have been proposed. One such approach is described by Yando in U.S. Pat. No. 3,439,416. Yando describes components or structures placed, trapped, or vibrated on an array of magnets. The magnets include magnetized layers alternating with non-magnetized layers to form a laminated structure. Components are matched onto the array of magnets forming an assembly thereof. However, severe limitations exist on the shape, size, and distribution of the components. For example, the component width must match the spacing of the magnetic layers, and the distribution of components is constrained by the parallel lamination geometry. In addition, self-alignment of the components requires the presence of the laminated structure. Furthermore, the structures disclosed by Yando typically possess millimeter-sized dimensions and are therefore generally incompatible with micron-sized integrated circuit structures.

Another fabrication approach is described in U.S. Pat. No. 5,034,802 to Liebes et al., and involves mating physical features between a packaged surface mount device and substrate. The assembly process described requires a human or robotics arm to physically pick, align, and attach a centimeter-sized packaged surface mount device onto a substrate. Such a process is limiting because of the need for the human or robotics arm. The human or robotics arm assembles each packaged device onto the substrate one-by-one and not simultaneously, thereby limiting the efficiency and effectiveness of the operation. Moreover, the method uses centimeter-sized devices (or packed surface mount integrated circuits), and has little applicability to the assembly of micron-sized objects.

Another approach described in U.S. Pat. No. 4,542,397 to Biegelsen et al., involves a method of placing parallelogram-shaped structures onto a substrate by mechanical vibration. Alternatively, the method employs pulsating air through apertures in the support surface (or substrate). A limitation to the method is that it requires an apparatus capable of vibrating the structures, or an apparatus for pulsating air through the apertures. Moreover, the method described relies upon centimeter-sized dies and has little applicability to the assembly of micron-sized objects.

A further approach is described in U.S. Pat. No. 4,194,668 to Akyurek, which discloses an apparatus for aligning and soldering electrode pedestals onto solderable ohmic anode contacts. The anode contacts are portions of individual semiconductor chips located on a wafer. Assembling the structures requires techniques of sprinkling pedestals onto a mask and then electromagnetic shaking of the pedestals for alignment. The method is limited because of the need for a shaking apparatus for the electromagnetic shaking step. In addition, the method also requires a feed surface gently sloping to the mask for transferring electronic pedestals onto the mask. Moreover, the method is solely in context to electrode pedestals and silicon wafers, thereby limiting the use of such method to these structures.

Still another approach is described U.S. Pat. No. 5,355,577 to Cohn, which discloses assembling integrated circuits onto a substrate through electrostatic forces. The electrostatic forces vibrate particles into a state of minimum potential energy. A limitation with the method includes having to provide an apparatus capable of vibrating particles with electrostatic forces. Moreover, the method of Cohn tends to damage the integrated circuits by mechanically vibrating them against each other. Accordingly the method typically becomes incompatible with a state-of-art microstructures.

U.S. Pat. No. 6,796,867 to George et al., discloses a web fabrication process for manufacturing light-emitting displays as part of a high-speed, continuous in-line process. In an embodiment of the George invention, an electrostatic sheet transfer (EST) process is used to place microcomponents in corresponding sockets. In the context of the George invention, the microcomponents are light-emitting devices. The light-emitting devices are charged with one type of charge and are distributed over the oppositely charge substrate. The microcomponents adhere to the sockets because of the charge difference. Those microcomponents that do not form an electrostatic bond with corresponding sockets are removed (e.g., shaken or blown) from the substrate surface. While the process of the George patent is generally able to place microcomponents in the form of light-emitting devices into sockets for the particular application of forming a light panel, it has a number of shortcomings that prevent it from being more generally applicable to forming micro-assemblies by manipulating and assembling micro-objects. In particular, the George process lacks the ability to orient the micro-objects in specific directions. Further, the method is not particularly amenable to efficiently assembling a micro-assembly that utilizes a number of different types of micro-objects.

SUMMARY OF THE INVENTION

One aspect of the invention is a method of forming a micro-assembly. The method includes sorting and orienting a plurality of micro-objects and providing the sorted and oriented micro-objects to an image transfer unit. The method further includes transferring the sorted and oriented micro-objects from the image transfer unit to a substrate, and then fixing the transferred micro-objects to the substrate to form a micro-assembly.

A second aspect of the invention is a method of forming a micro-assembly. The method includes encoding each of one or more micro-objects with a charge that identifies each micro-object and specifies its orientation. The method further includes providing the sorted charge-encoded micro-objects to a xerographic imaging unit. The xerographic imaging unit is adapted to receive and carry the sorted charge-encoded micro-objects, e.g., via an electrostatic image. The method also includes transferring the sorted charge-encoded micro-objects from the xerographic imaging unit to a substrate, and fixing the transferred micro-objects to the substrate to form a micro-assembly. The method optionally further includes operably interconnecting the micro-objects, such as by metal wiring in the case where the micro-objects are microchips.

A third aspect of the invention is a micro-assembler apparatus for forming a micro-assembly from one or more micro-objects. The micro-objects are charge-encoded in a manner that identifies each micro-object and specifies an orientation for sorting. The micro-assembler includes an image transfer unit adapted to receive sorted charge-encoded micro-objects, and maintain the sorting while delivering the micro-objects to a substrate. The micro-assembler also includes a post-processing unit adapted to receive the substrate with the sorted micro-objects and fix the micro-objects to the substrate, as well as optionally interconnecting the micro-objects, e.g., via electrical wiring.

A fourth aspect of the invention is a pre-sorted micro-assembler apparatus for forming a micro-assembly from one or more micro-objects. The apparatus includes an image transfer unit adapted to receive sorted charge-encoded micro-objects, maintain the sorting, and selectively deliver the sorted micro-objects to a substrate. An embodiment of the image transfer unit includes two conveyors operating at right angles to one another, where one conveyor receives the sorted micro-objects and delivers them to the other conveyor by selectively photoreleasing the micro-objects via a photorelease mechanism. The apparatus also includes a post-processing unit adapted to receive the substrate with the sorted micro-objects and fix the micro-objects to the substrate to form the micro-assembly.

Figure 1:
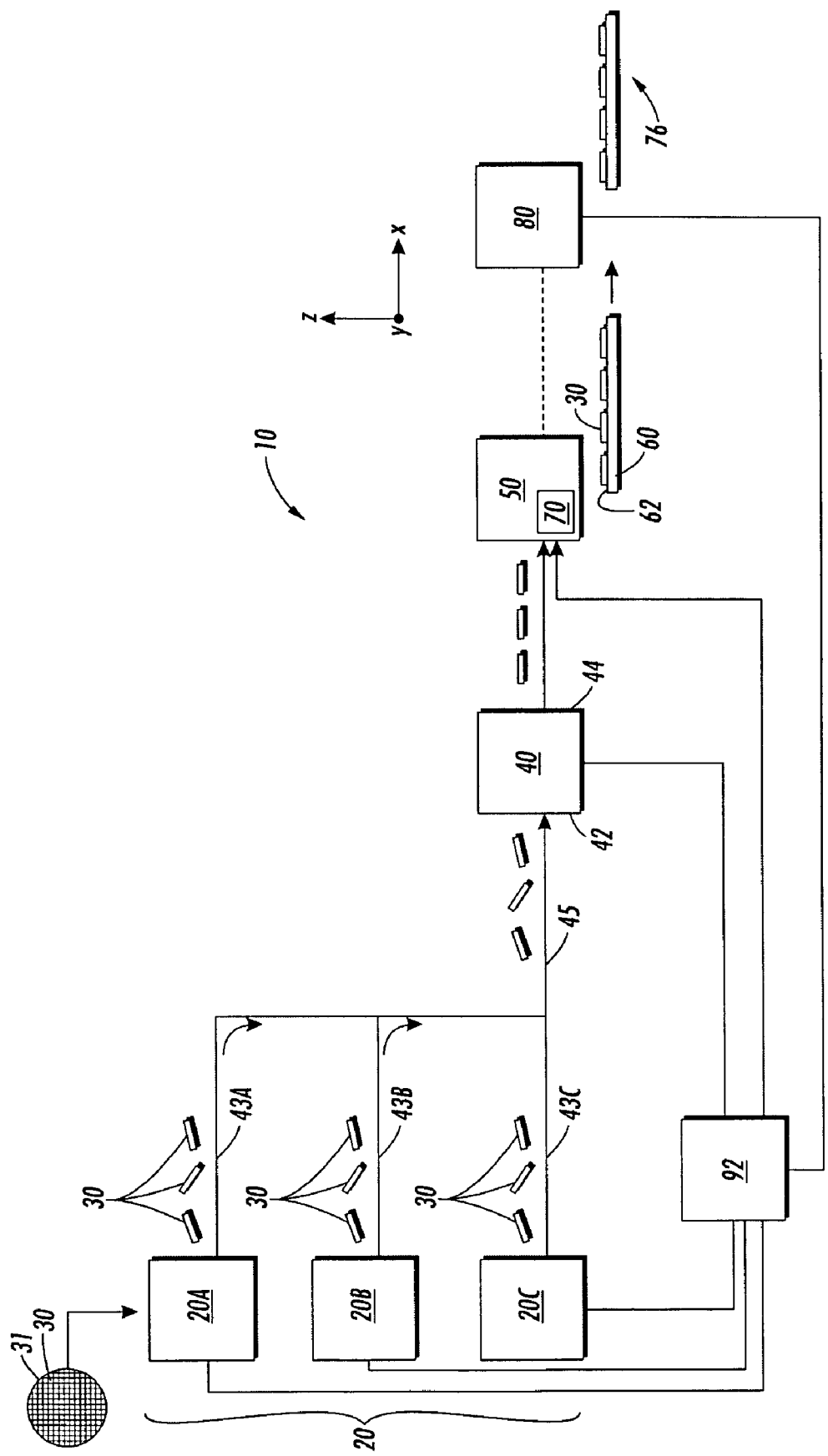
FIG. 1 is a schematic side view of an example embodiment of a micro-assembler according to the present invention.

The various elements depicted in the drawings are merely representational and are not necessarily drawn to scale. Certain sections thereof may be exaggerated, while others may be minimized. The drawings are intended to illustrate various embodiments of the invention that can be understood and appropriately carried out by those of ordinary skill in the art.

DETAILED DESCRIPTION OF THE INVENTION

The systems and methods described herein are directed to forming micro-assemblies by assembling micro-objects (i.e., micron-sized components) using electrical and mechanical forces to position and orient the micro-objects in a select relationship to one another. Writing a pattern of electrical charge onto the micro-objects that specifies their position and orientation for mass sorting and rapid assembly is a more versatile and customizable approach to forming micro-structures than cutting and stamping micro-objects of a particular size and shape and then trying to individually arranging their positions and orientations. In an example embodiment, the micro-assembly systems and methods described hereinbelow employ xerographic techniques in a unique manner to form the micro-assemblies.

The systems and methods described herein include in an example embodiment an electromechanical micro-assembler, described below, to fabricate a micro-assembly from a set of one or more micro-objects. An example fabrication process includes the following basic steps:1) encoding each micro-object with a charge that identifies the micro-object and specifies its orientation; 2) transporting the micro-objects from a sorting unit (that acts as a reservoir) to an imaging device using a dynamic electrostatic field; 3) writing an electrostatic image onto a substrate using an xerographic imaging unit; 4) delivering and interfacing the micro-objects to the substrate; and 5) performing post-processing of the micro-objects and the substrate form the final micro-assembly.

Micro-assembler

A generalized micro-assembler according to the present invention is first described, followed by a detailed explanation of each of the components of the micro-assembler.

GENERALIZED EXAMPLE EMBODIMENT

FIG. 1 is a schematic side view of an example embodiment of a micro-assembler 10 according to the present invention. Micro-assembler 10 includes one or more pre-processing units 20 (e.g., three such units 20A, 20B and 20C) adapted to modify, form or otherwise process different types (sets) of micro-objects 30, which are described below.

In an example embodiment reflecting the simplest case, pre-processing units 20 serve as reservoirs for micro-objects 30 that are pre-formed, e.g., as micro-chip-based micro-objects formed in a semiconductor fabrication facility using, for example, standard semiconductor processing techniques. In another example embodiment, pre-processing units 20 are adapted to form the micro-objects from a larger object, such as a semiconductor wafer having the micro-objects formed therein. FIG. 1 illustrates an example of this embodiment wherein a wafer 31 is provided to one of the pre-processing units for dicing into individual micro-objects 30. In another example embodiment, pre-processing units 20 are adapted to charge-encode micro-objects 30 (e.g., while they are still part of a larger object such as wafer 31) and then divide the larger object into micro-objects, e.g., using standard wafer dicing techniques.

Micro-assembler 10 also includes a sorting unit 40 having an input end 42 operably coupled to the pre-processors 20 via corresponding input lines (e.g., conveyers) 43, e.g., input lines 43A, 43B and 43C for pre-processors 20A, 20B and 20C, respectively. Sorting unit 40 also has an output end 44 operably coupled to an image transfer unit 50. Sorting unit 40 is adapted to receive micro-objects 30 from one or more of pre-processor units 20 (e.g., from a common input line 45 or separate input lines 43A, 43B and 43C), sort and orient the micro-objects, and then deliver the sorted and oriented micro-objects to the image transfer unit 50. Here, "sort" means separating different micro-objects from one another or placing like micro-objects in a particular order. Also, "orient" means spatially positioning each micro-object so that a feature (e.g., an axis, not shown) of the micro-object points in a select direction relative to a reference direction. In an example embodiment, sorting and orienting are based on each micro-object having an encoded charge, as described below.

Image transfer unit 50 is adapted to transfer sorted micro-objects 30 onto a substrate 60 having an upper surface 62. In an example embodiment, image transfer unit 50 has an image writer 70 that includes information, such as a digitally stored electronic image, and writes the image information onto a surface capable of supporting an electrostatic image, as discussed below.

Micro-assembler 10 also includes a post-processing unit 80 arranged downstream of and operably coupled to image transfer unit 50. Post-processing unit 80 is adapted to receive substrate 60 from image transfer unit and perform post-processing of the substrate and micro-objects 30 thereon, such as pressing the micro-objects into the substrate, or removing extraneous micro-objects from the substrate, to form a micro-assembly 76.

Micro-assembler 10 further includes a main controller 92 operably coupled to pre-processor systems 20, sorting unit 40, image transfer unit 50 and post-processor unit 80, to control and coordinate the operation of the micro-assembler.

Charge-encoded micro-objects

In certain cases, it is desirable to be able to manipulate the micro-objects so that they can be readily sorted and/or oriented. Thus, in an example embodiment, micro-objects 30 are encoded with a charge. In the specific case where orientation is required, the charge is patterned to a shape without rotational symmetry so that select electrical and/or magnetic forces applied to the micro-object can place it in a desired orientation. Such a patterned charge can be formed on a micro-object using a variety of techniques, such as by forming a conductive or charge-maintaining directional feature such as a stripe.

Figure 2:
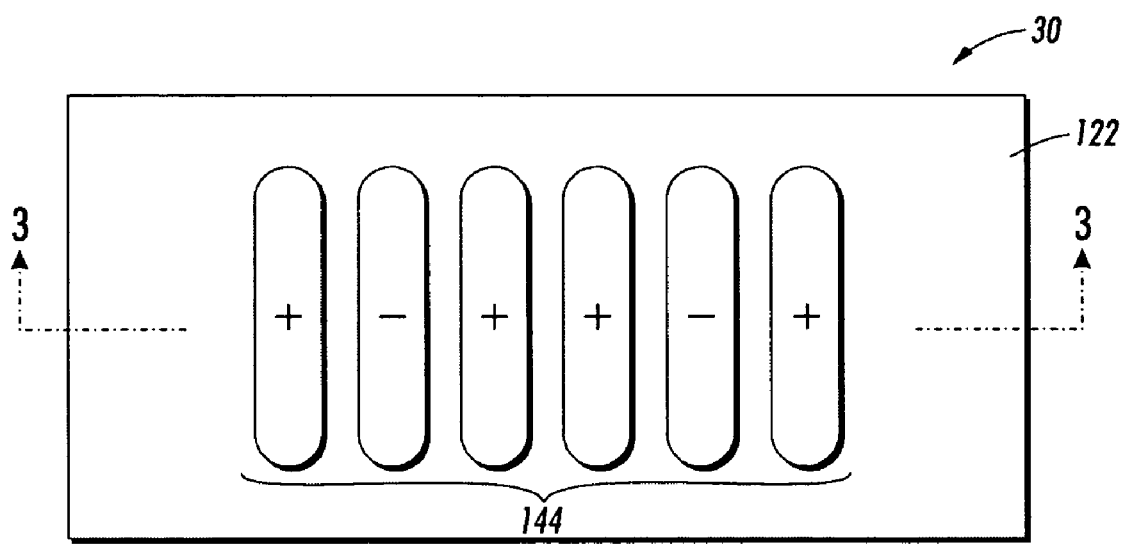
FIG. 2 is a plan view of an example embodiment of a charge-encoded micro-object.
Figure 3:
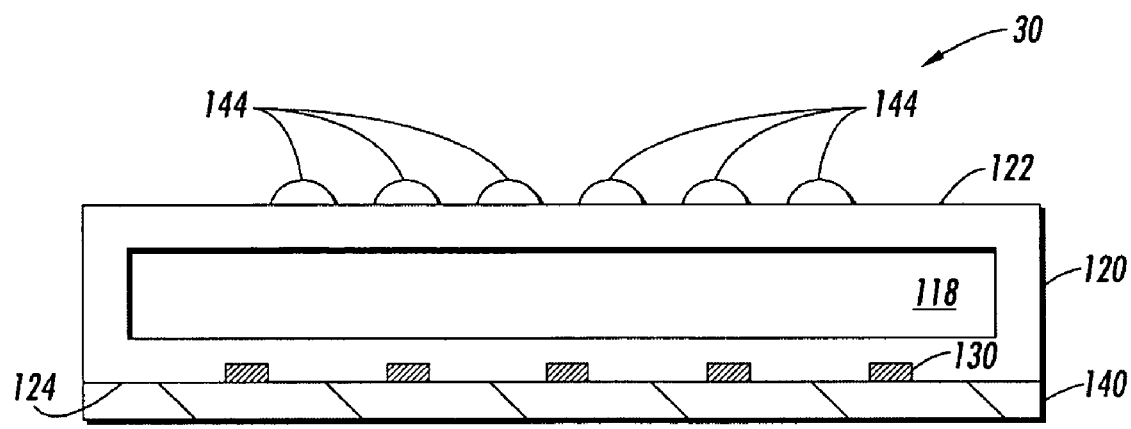
FIG. 3 is a cross-sectional view of the micro-object of FIG. 2, taken along the line 3-3.

FIG. 2 is a plan view of an example charge-encoded micro-object 30. In an example embodiment, micro-object 30, is or includes a charge-encoded microchip formed using standard semiconductor processing techniques. FIG. 3 is a cross-sectional view of micro-object 30 of FIG. 2, taken along the line 3-3. In an example embodiment, micro-object 30 includes a micro-body 118 around which is formed an insulating layer 120 having an upper surface 122 and a lower surface 124. In an example embodiment, micro-body 118 is or includes a microchip. Micro-object 30 also optionally includes magnetic strips 130 formed within insulator 120 and arranged so that the micro-object can be magnetically manipulated, as discussed below. In an example embodiment, magnetic strips 130 are formed from a ferromagnetic metal such as Nickel.

Micro-object 30 also includes a thin conducting layer 140 formed on insulating layer lower surface 124. Conducting layer 140 serves to prevent electrostatic discharge damage to micro-body 118, particularly in the case where the micro-body is or includes a microchip. Conducting layer 140 can include, for example, a metal, an organic conductor, or doped amorphous silicon.

With continuing reference to FIGS. 2 and 3, micro-object 30 further includes one or more charge-encoded elements 144 attached to upper surface 122 of insulating layer 120. Charge-encoded elements 144 can include, for example, materials with either basic or acidic surfaces capable of carrying either positive or negative charge in non-polar liquids with charge control agents. Such materials are well-known, and examples include two-particle electrophoretic ink, liquid toner, inorganic oxides (e.g., $SiO_2$ and $Al_2O_3$), and polymers. Standard photolithography or ink-jet technology can be used to pattern these materials to form charge-encoded elements 144.

In an example embodiment, strips 130, conducting layer 140 and charge-encoded elements 144 are added to a microbody 118 by c-Si CMOS processes, III-V optoelectronics processes, MEMS processes, or any other standard planar semiconductor fabrication process. In an example embodiment, the charge encoding the micro-objects is accomplished by tribocharging pre-defined electrostatic material at the wafer level (e.g., in pre-processing unit 20) prior to the micro-objects being formed by dicing the wafer.

Micro-objects 30 can be thought of as the analog of toner particles used in a Xerographic printer, except that the micro-objects are fully functional devices instead of inert particles.

Charge-encoded elements 144 can serve two main functions. First, they are used to break rotational symmetry of the micro-objects by selectively charge-encoding the elements such that they can be selectively oriented for sorting. For example, charge-encoded elements 144 are shown in FIG. 2 as being encoded with a select charge pattern as indicated by the "+" and "−" signs. In an example embodiment reflecting the simple case where only one type of micro-object is used, the charge-encoding pattern could be any shape without rotational symmetry.

Second, different micro-objects 30 having different encoded charge patterns for elements 144 allow for the identification and filtering of the micro-objects by engineered electrostatic fields. This allows for different types of micro-objects 30 to be assembled in a single step, in analogy to having a toner with different colors. Note that for the simplest form of a micro-assembly, namely, wherein only one type of micro-object 30 is used, only a single type of charge carrying material (positive or negative) with minimal patterning is required.

Sorter unit

In an example embodiment, charge-encoded micro-objects 30 are provided (e.g., conveyed) from the pre-processor units 20 to sorting unit 40.

Figure 4:
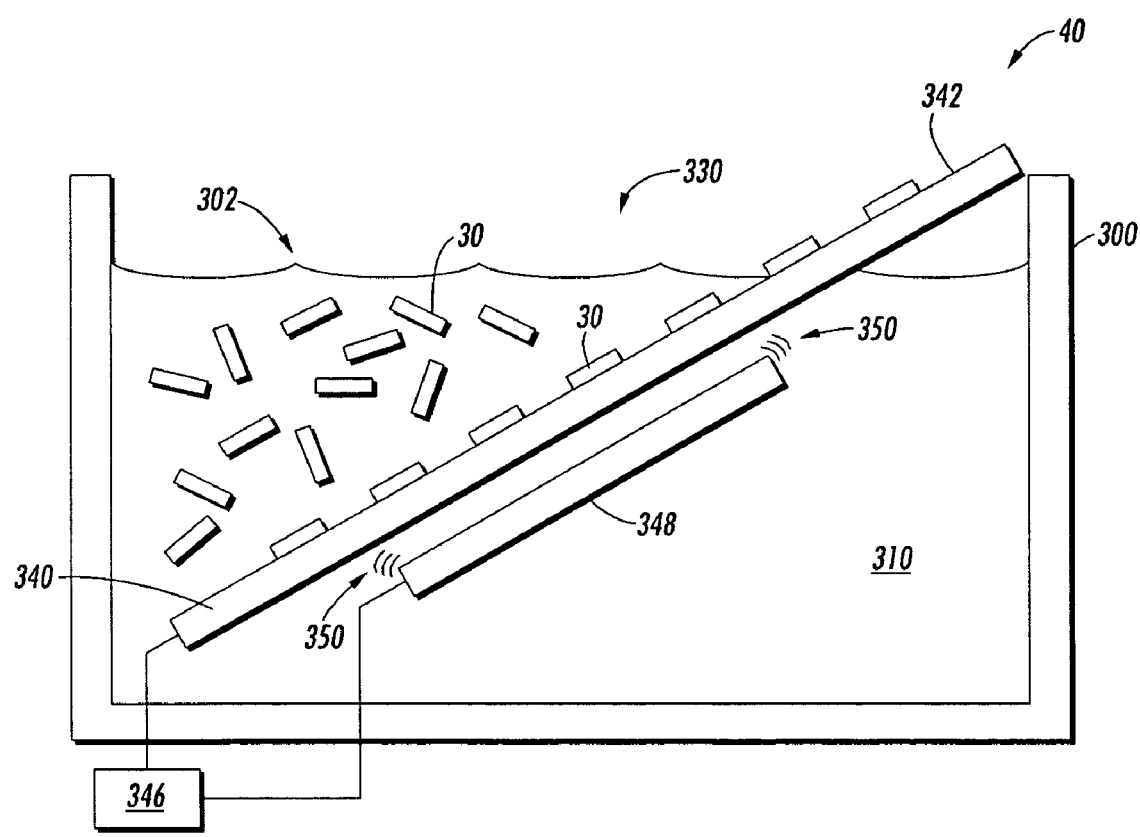
FIG. 4 is a schematic cross-sectional view of an example sorting unit for the micro-assembler of FIG. 1.

FIG. 4 is a schematic cross-sectional view of an example embodiment of a sorting unit 40. Sorting unit 40 of FIG. 4 includes a container 300 having an interior 302 that holds a liquid medium 310. In an example embodiment, liquid medium 310 is a mixture of a non-polar liquid and charge-control agents. Micro-objects are provided to interior 302 from pre-processors 20 in a manner that leaves the micro-objects suspended in liquid medium 310, as illustrated.

Sorting unit 40 further includes a conveying unit 330. Conveying unit 330 includes a planar addressable electrostatic conveyor member 340 having an upper surface 342. A major portion of conveyor member 340 extends into interior 302 and through liquid medium 310 contained therein. Conveyor member 340 is operably coupled to a controller 346 adapted to control and coordinate the operation of the conveyor member, as described in greater detail below.

At this stage, micro-objects 30 and liquid medium 310 closely resemble the liquid developer found in some conventional xerographic copiers and printers. A major difference as compared to a typical xerography system, however, is that the systems and methods described herein involve positioning micro-objects at designated locations and with select orientations. This is analogous to the approach used in a xerographic toner mover, but with a much higher degree of complexity and functionality.

With continuing reference to FIG. 4, in an example embodiment the required positioning and orientation of micro-objects 30 is accomplished in sorting unit 40 through the use of a dynamic electrostatic field provided by conveying unit 330, and in particular by electrostatic conveyor member 340 and through the operation of controller 346 as discussed in greater detail below. Also shown in FIG. 4 is an example embodiment wherein sorting unit 40 includes an electromagnet 348 coupled to controller 346 and in magnetic communication with micro-objects 30 and conveyor 340. Electromagnet 348 is adapted to provide a static or dynamic magnetic field 350 that can control the orientation of those micro-objects 30 designed to respond to magnetic field 350, e.g., through the interaction of the magnetic field with magnetic strips 130.

Figure 5:
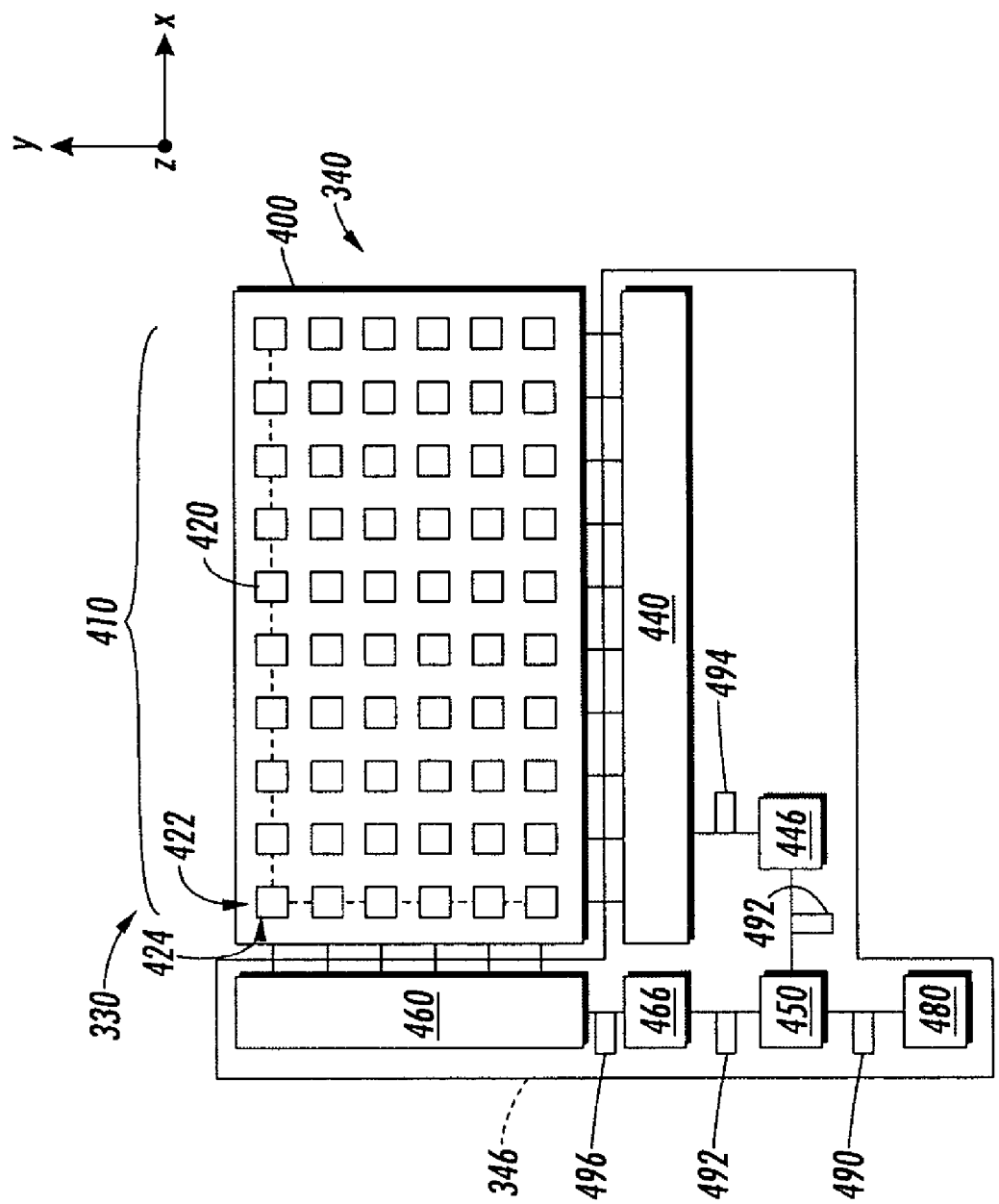
FIG. 5 is a plan view of an example embodiment of the conveying unit of the sorting unit of FIG. 4, with X-Y coordinates shown for reference, wherein the conveying unit is capable of providing a dynamic electrostatic field.

FIG. 5 is a plan view of an example embodiment of conveying unit 330, with X-Y coordinates shown for reference. Electrostatic conveyor member 340 is in the form of an insulating (e.g., glass) plate 400 having an array 410 of addressable metal electrodes 420 capable of forming a dynamic electrostatic field. Array 410 includes rows 422 and columns 424. Electrode array 410 can be formed with the standard active matrix networks similar to the ones found in Active Matrix Liquid Crystal Displays (AMLCDs) using thin-film transistors (TFTs). A two-dimensional dynamic electrostatic field is desirable since it enables the movement of charge-coded micro-objects 30 in both the X and Y directions to the exact positions required for sorting.

With continuing reference to FIG. 5, controller 346 includes a gate line driver 440 operably coupled to electrode columns 422 of electrode array 410. Gate line driver 440 is operably coupled to a gate line multiplexer 446, which in turn is coupled to an analog-to-digital (A/D) converter 450.

Controller 346 also includes a data line driver 460 operably coupled to rows 424 of electrode array 410. Data line driver 460 is operably coupled to a data line multiplexer 466, which is operably coupled to A/D converter 450. A/D converter 450 is operably coupled to a programmable waveform generator 480. Programmable waveform generator 480 is adapted to generated an analog signal 490 corresponding to a desired dynamic electrostatic field to be created via the selective activation of electrodes 420.

With continuing reference to FIG. 5, in the operation of conveying unit 330, waveform generator 480 generates and sends analog signal 490 to A/D converter 450. Signal 490 represents the two-dimensional dynamic electrostatic field to be generated by addressable array 410. A/D converter 450 converts analog signal 490 to a corresponding digital signal 492, which is provided to gate line multiplexer 446 and data line multiplexer 466. Gate line multiplexer 446 forms from signal 492 corresponding column signals 494, which are received by gate line driver 440 and provided to corresponding columns 422 in electrode array 410 so that each column in the electrode array is activated according to the desired waveform.

Likewise, digital waveform signal 492 is provided to data line multiplexer 466. Data line multiplexer 466 forms from signal 492 corresponding row signals 496, which are received by data line driver 460 and provided to corresponding rows 424 in electrode array 410 so that each row in the electrode array is activated according to the desired waveform. The activation of electrodes 420 by column and row signals 494 and 496 serve to generate the desired dynamic electrostatic field that conveys micro-objects 30 to image transfer unit 50.

To efficiently sort the unsorted micro-objects 30 suspended within liquid medium 310 (FIG. 4) into the designed distribution pattern with the proper orientation, various techniques developed for crystal growth can be used. For example, simulated annealing is an example used in computer algorithms for finding a global minimum, and this technique is suitable for use in the present invention.

Figure 6:
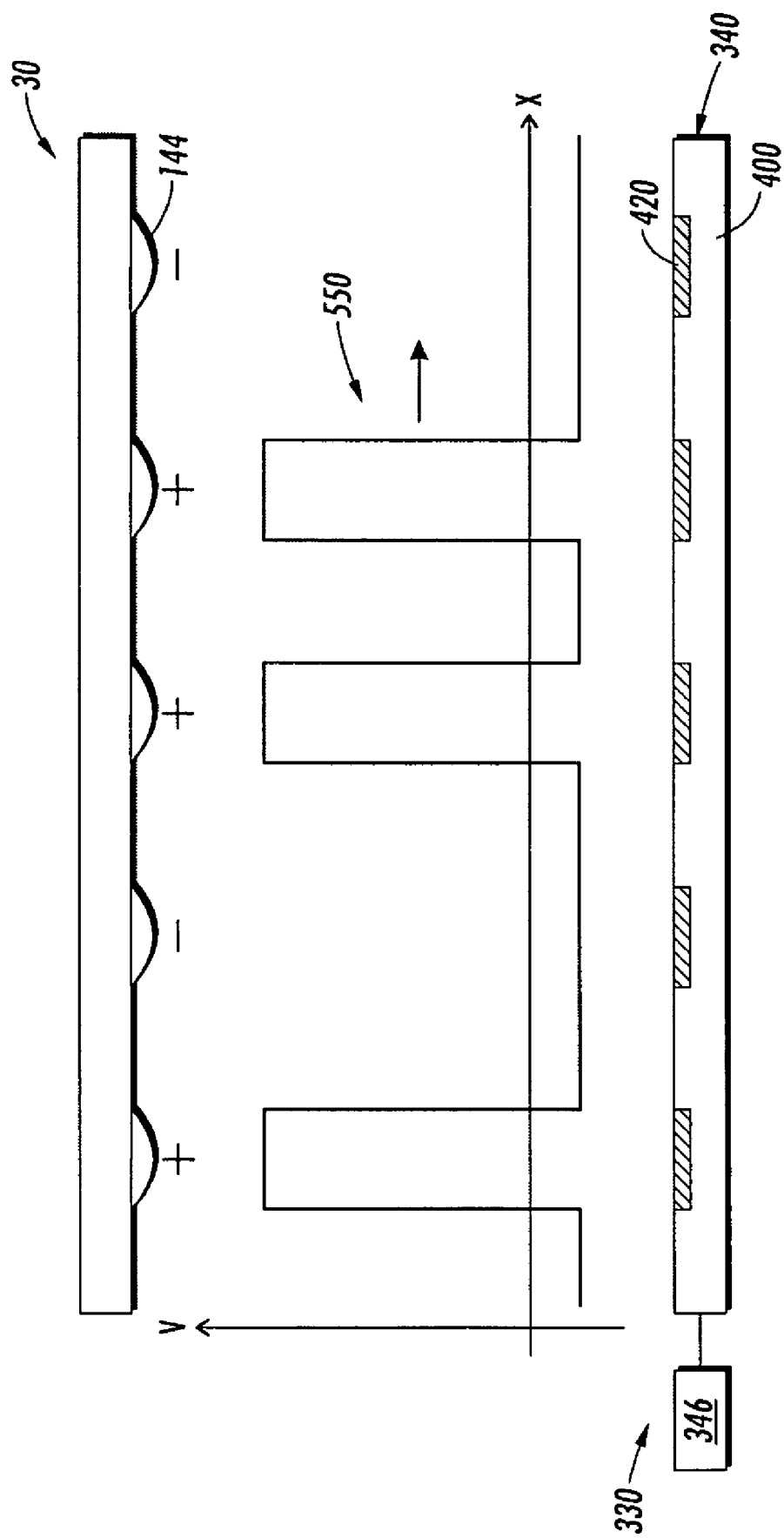
FIG. 6 is a close-up side view of the conveyor member of the conveying unit of FIG. 5, along with an example micro-object and an example dynamic electrostatic transport field created by the conveying unit.

In an example embodiment, the dynamic electrostatic field generated by two-dimensional electrode array 410 can be considered as a superposition of two different fields: a transport field and an annealing field. FIG. 6 is a close-up side view of conveying member 340 of conveying unit 330, along with an example micro-object 30 and an example dynamic electrostatic transport field 550. The vertical axis represents the voltage V applied to the electrodes 420 in the particular row 424 of the electrode array via controller 346. Transport field 550 is an electrostatic field matched exactly to the charge pattern encoded onto one or more micro-objects 30. Transport field 550 moves in the positive X-direction so that the appropriately charge-encoded micro-objects, which become electrostatically coupled to the matched transport field, move in the X-direction.

Figure 7:
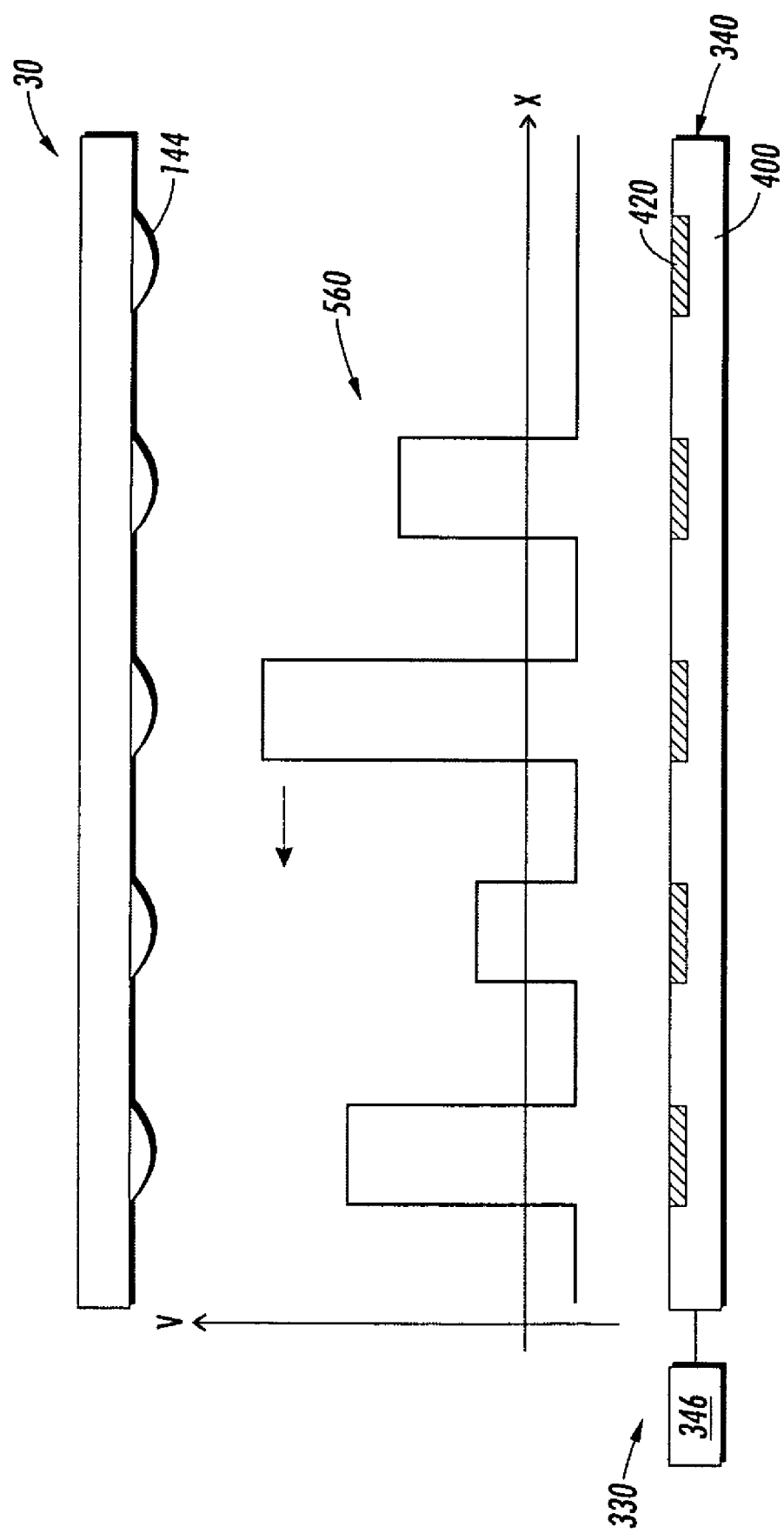
FIG. 7 is similar to that of FIG. 6, but showing an example dynamic electrostatic annealing field.

FIG. 7 is a close-up side view similar to that of FIG. 6, but showing an example annealing field 560. Annealing field 560 is, for example, a random field moving in the negative X-direction. The combined effect of transport field 550 and annealing field 560 creates a "temperature gradient," in the dynamic electrostatic field such that the micro-objects 30 move more randomly in the container, in analogy to gas particles at a high temperature. Thus, only those micro-objects 30 that have a charge encoding that exactly matches transport field 550 will have a significant positive X-direction movement and be transported to image transfer unit 50, in analogy to gas particles cooling down. The non-charged-matched micro-objects 30 will remain suspended and thus remain at a "high temperature state" due to the effect of annealing field 560. In an example embodiment, mechanical steering and/or an alternating magnetic field 350 is added in the negative X-direction via electromagnet to increase the "flipping" motion of the micro-objects and facilitate their removal from conveying member 340 so that they are not conveyed to image transfer unit 50.

Image transfer unit

With reference again to the micro-assembler 10 of FIG. 1, the micro-objects 30 coming out of sorting unit 40 are essentially ordered with the select orientation and select relative positions, and move with constant speed in the X-direction. Micro-objects 30 now need to be delivered to substrate 60 to form the desired micro-assembly.

In principle, micro-objects 30 can be delivered directly from sorting unit 40 to the substrate. However, this approach can result in a large amount of friction and wear between substrate 60 and conveying member 340. Also, maintaining the sorting of the micro-objects during such direct delivery may prove difficult in practice.

Figure 8:
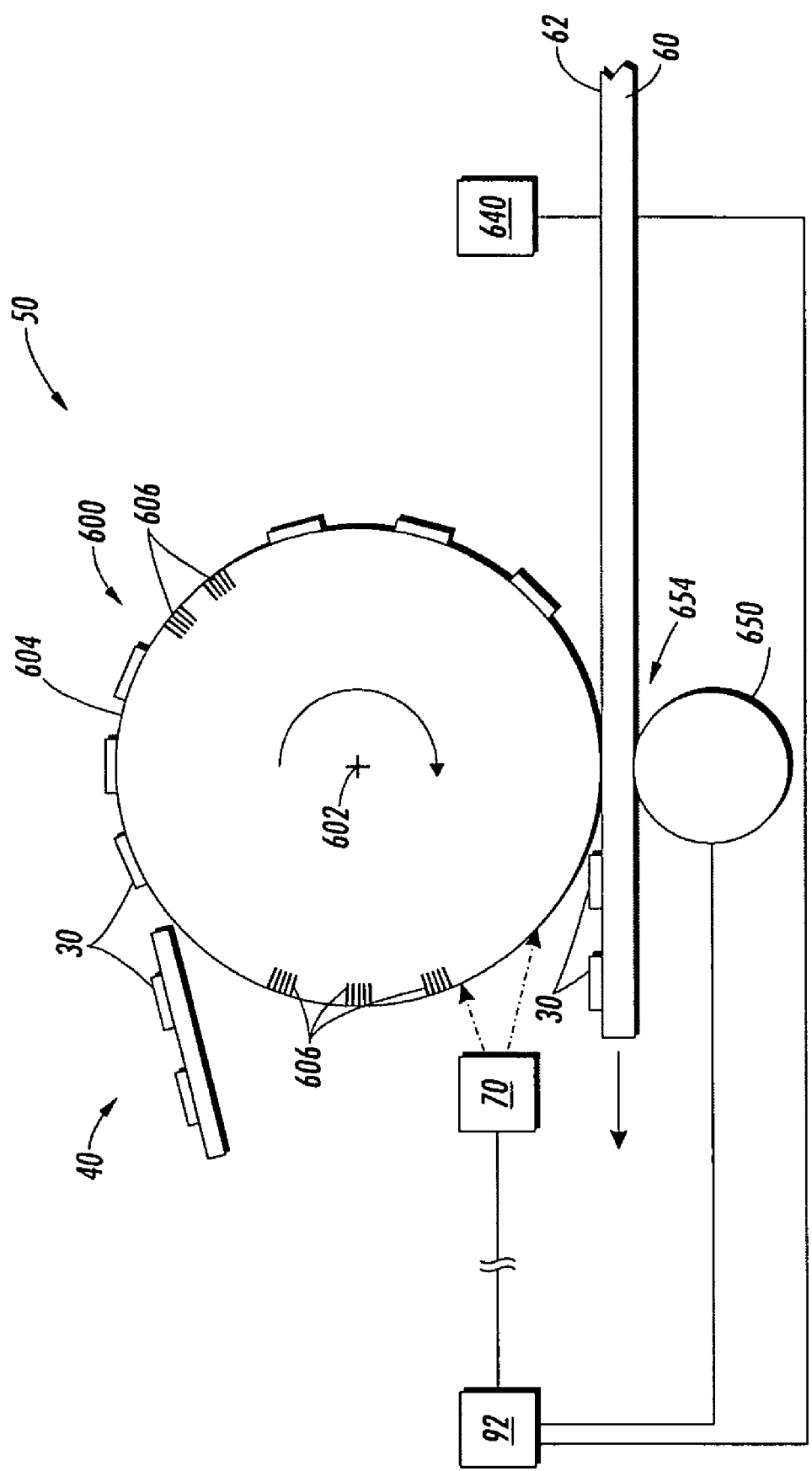
FIG. 8 is a schematic close up side view of an example embodiment of the image transfer unit of the micro-assembler of FIG. 1, wherein the image transfer unit includes a rotatable transfer drum adapted to support an electrostatic image.

FIG. 8 is a schematic close up side view of an example embodiment of image transfer unit 50 of micro-assembler 10. Image transfer unit 50 includes a rotatable transfer drum 600. Transfer drum 600 has a rotational axis 602 and an outer surface 604 capable of supporting an electrostatic image 606. Image transfer unit 50 is arranged adjacent to sorter unit 40 so as to receive the sorted micro-objects 30 onto drum outer surface 604.

The image-forming process in according with the systems and methods described herein relates to forming a select arrangement of micro-objects 30 onto substrate surface 62. In an example embodiment, image forming is achieved ostensibly by the selective arrangement of micro-objects 30 that occurs in sorting unit 40. However, it is still helpful to have electrostatic images 606 formed on transfer drum outer surface 604. Accordingly, image transfer unit 50 includes an image writer 70 in operable communication with drum outer surface 604. Image write 70 is adapted to encode an electrostatic image 606 onto outer surface 604 using, for example, techniques known in xerography. In an example embodiment, image writer 70 is programmable to form a desired electrostatic image 606. In another example embodiment, image writer 70 is adapted to receive an electronic image (e.g., a rasterized electronic image obtained from optically scanning a master image) and transfer that image to drum outer surface 604 as electrostatic image 606.

Charge-encoded micro-objects 30 will electrostatically adhere to drum outer surface 602 in a manner that corresponds to electrostatic image 606. Thus, when electrostatic image 606 is representative of the select sorting required to form the micro-assembly, the micro-objects will maintain their relative positions on the drum during the process of transferring the micro-objects to substrate 60. Electrostatic image 606 helps to relieve the resolution requirement imposed on sorting unit 40 by providing an additional means for positioning, orienting and securing micro-objects 30 prior to their being delivered to substrate 60.

In an example embodiment, substrate 60 has an adhesive upper surface 62 to facilitate the delivery and placement of micro-objects 30 from imaging unit 50. For example, substrate 60 may be made of plastic, and upper surface 62 may be heated to near its glass transition temperature. This may be accomplished, for example, by image transfer unit 50 having a heating element 640 arranged upstream of transfer drum 600 and in thermal communication with substrate upper surface 62, as illustrated in FIG. 8. Substrate 60 is then brought into contact with transfer drum outer surface 604. Micro-objects 30 that are electrostatically adhered to the drum are then transferred from the drum and fixed to substrate surface 62 due to the adhesive substrate surface.

Alternatively, electrostatic transfer of micro-objects to substrate 60, as used in most xerography systems, can also be employed. With reference again to FIG. 8, in an example embodiment, imaging unit 50 includes an electrostatic transfer roller 650 coupled to controller 92. Electrostatic transfer roller 650 is arranged adjacent drum 600, but on the opposite side of substrate 60, thereby forming a nip 654 through which the substrate passes. Electrostatic transfer roller 650 is adapted to form electrostatic image 606 onto drum outer surface 604 according to conventional xerography.

Figure 9:
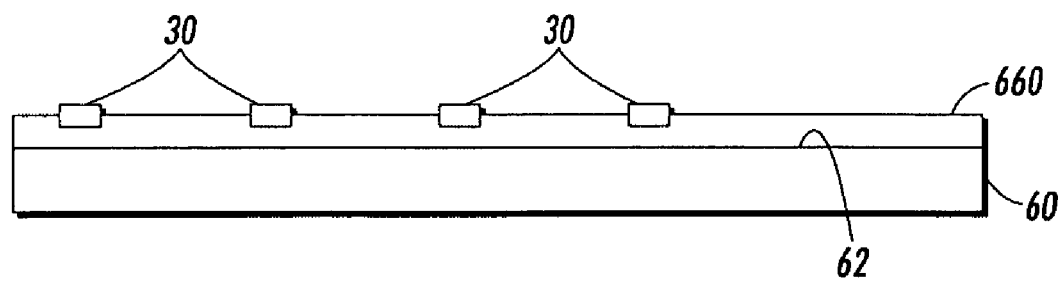
FIG. 9 is a close-up side view of a substrate having a pliable layer formed atop the substrate upper surface to facilitate fixing micro-objects to the substrate.

The use of a substrate 60 having a pliable upper surface 62 has the advantage that micro-objects 30 can be pressed into the upper surface and planarized in the same process step, or alternatively, in a post-processing step. FIG. 9 is a close-up side view of an example embodiment of substrate 60 having a pliable layer 660 formed atop substrate upper surface 62. In an example embodiment, substrate 60 is formed from a rigid material, such as glass or c-Si, and pliable layer 660 is formed by layering or laminating the substrate with a pliable material, such as plastic, prior to the transfer of micro-objects 30 to the substrate.

Post-processing unit

Figure 10:
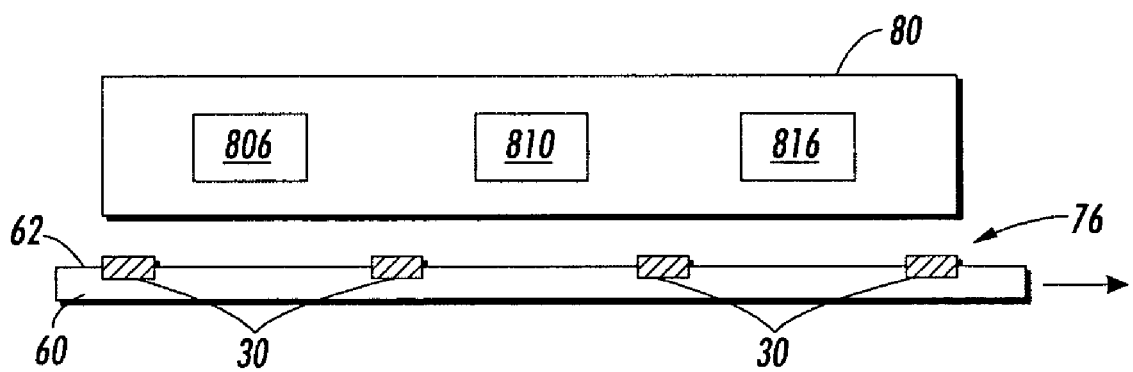
FIG. 10 is a schematic close-up diagram of an example post-processing unit of the micro-assembler of FIG. 1.

As discussed above in connection with FIG. 1, in an example embodiment, micro-assembler 10 optionally includes post-processing unit 80. FIG. 10 is a schematic close-up diagram of an example embodiment of post-processing unit 80. Post processing unit 80 is adapted to receive substrate 60 from image process unit 50 and perform post-processing of the substrate. Post-processing steps include such operations as pressing micro-objects 30 into the substrate to form a micro-assembly 76, planarizing the substrate and micro-objects to facilitate the interconnection of the micro-objects, and providing operable interconnections between the micro-objects, such as wiring together microchip-based micro-objects.

The example embodiment of post-processing unit 80 of FIG. 10 includes an etch unit 806 and a cleaning unit 810, respectively adapted to perform a post-etching process and a cleaning process of substrate 60 and micro-assembly 76. In an example embodiment, the post-etch process from etch unit 806 removes charge-encoding elements 140, strips 130 and conducting layer 140 from micro-objects 30, leaving micro-body 118 (FIG. 3) exposed. The post-etch process may include, for example, a standard wet process or dry process, e.g., atmospheric pressure plasma etch.

In an example embodiment, post-processing steps are performed in post-processing unit 80 so that electrical connections between the assembled micro-objects (or micro-bodies) can be established, e.g., in the case where the micro-bodies are microchips. This involves a post-process wiring step, which may include, for example, standard metallization processes, such as sputtering or evaporization, to form a continuous metal layer on substrate surface 62 that interconnects micro-objects 30. Standard photolithography and etching can then be used to finish the wiring process. In an example embodiment, post-process wiring is performed by a wiring unit 816 in operable communication with substrate 60 passing thereunder. In an example embodiment, wiring unit 816 is adapted to perform standard metallization as is known in the art of semiconductor manufacturing.

To achieve a true printed electronic process, however, in an example embodiment wiring unit 816 is adapted to print conductive lines and includes, for example, an ink-jet print head adapted to form lines of molten metal, metal colloid, or organic conductor. In another example embodiment, wiring unit 816 is adapted to perform xerographic printing of metal particles followed by low-temperature sintering.

Figure 11:
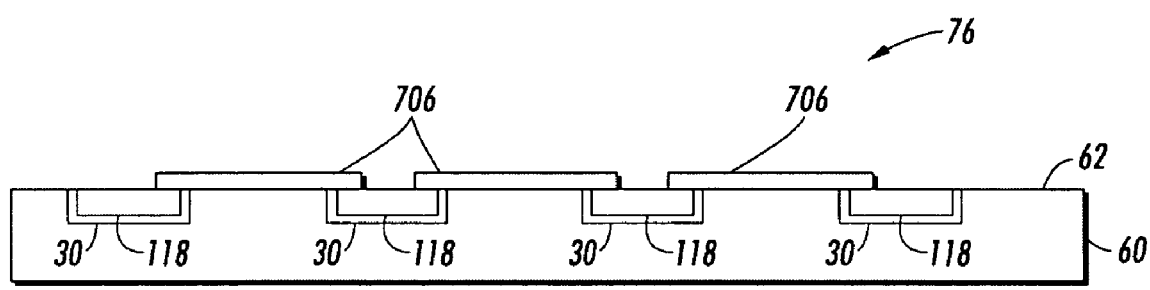
FIG. 11 illustrates in example embodiment of a finished micro-assembly formed by the micro-assembler of FIG. 1, wherein four different micro-objects have been stripped down to their microchip micro-bodies and electrically interconnected by metal lines formed during post-processing in the post-processing unit.

FIG. 11 illustrates in example embodiment of a finished micro-assembly 76, wherein four different micro-objects have been embedded into substrate 60, planarized down to expose micro-bodies 118, and then interconnected by metal lines 706. In an example embodiment, the microbodies 118 of FIG. 11 are microchips, e.g., from left to right, a GaAS VCSEL, a BiCMOS driver, a CMOS processor, and a GaAs PIN photo-diode.

Pre-sorted Micro-assembler

Figure 12:
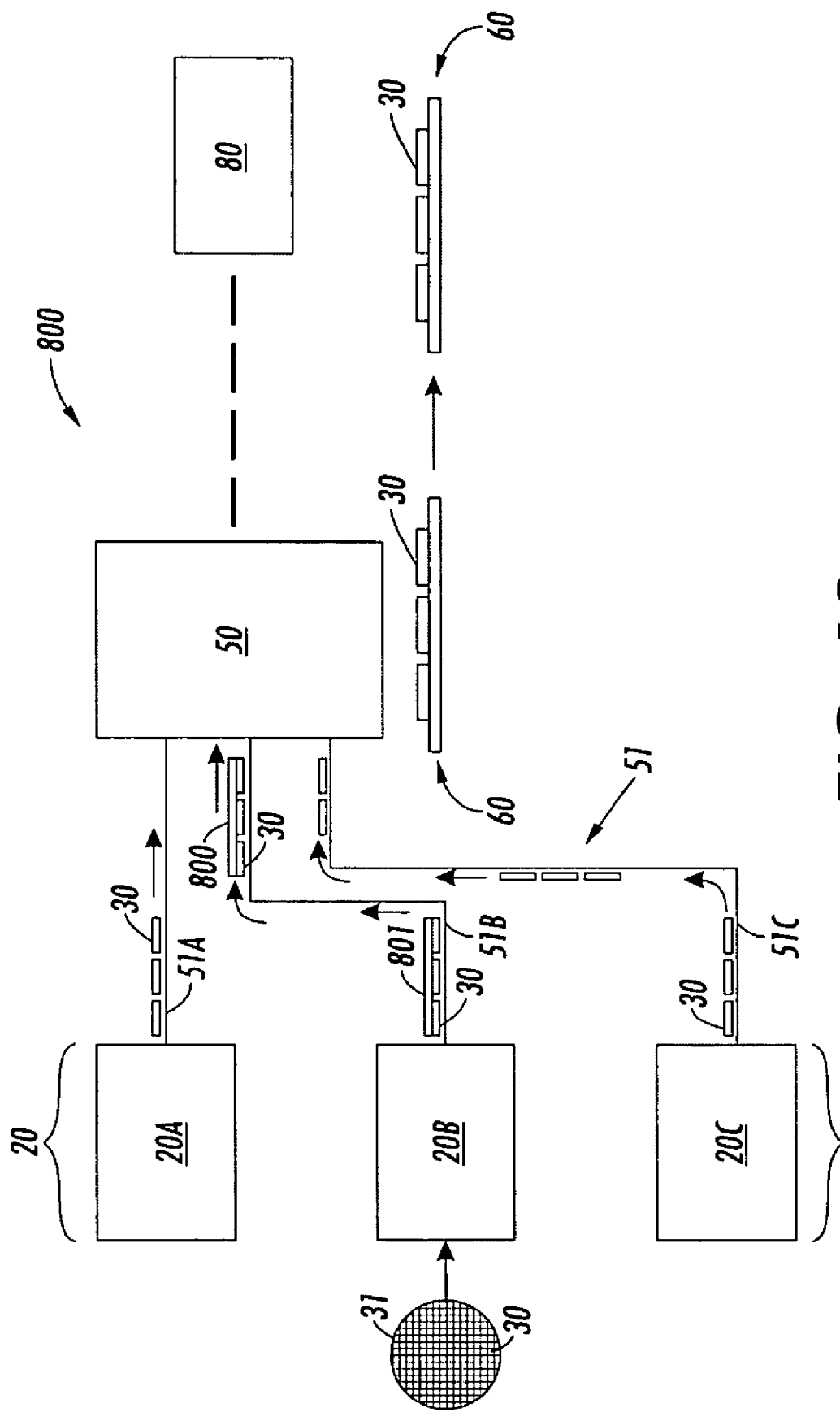
FIG. 12 is a schematic diagram of an example embodiment of a pre-sorted micro-assembler adapted to process micro-objects provided to the image transfer unit in a predefined order and orientation by the one or more pre-processing units, rather than having to sort the micro-objects in a sorting unit.

FIG. 12 is a schematic side view of an example embodiment of a pre-sorted micro-assembler 800 adapted to receive micro-objects 30 in a predefined order and orientation, rather than having to sort them, e.g., from a random suspension of micro-objects in a sorting unit such as sorting unit 40. In this regard, micro-assembler 800 is similar to micro-assembler 10 of FIG. 1, but without sorting unit 40.

In an example embodiment, the necessary sorting of micro-objects 30 is performed in pre-processor units 20. The sorted micro-objects 30 are then provided to image transfer unit 50 via corresponding input lines 51, e.g., input lines 51A, 51B and 51C for pre-processor units 20A, 20B and 20C, respectively. In this regard, each pre-processing unit 20 can be thought of as including a sorting unit.

As discussed above in connection with micro-assembler 10, in an example embodiment, micro-objects 30 are formed in a wafer using standard semiconductor processing techniques, and the wafer diced into chips that serve as the micro-objects. To maintain the micro-objects in their wafer-level arrangement, in an example embodiment the micro-objects are diced and transferred directly to a releasable-adhesive substrate 801, which is then provided to image transfer unit 50. This is illustrated in FIG. 12 in connection with pre-processing unit 20B.

Figure 13:
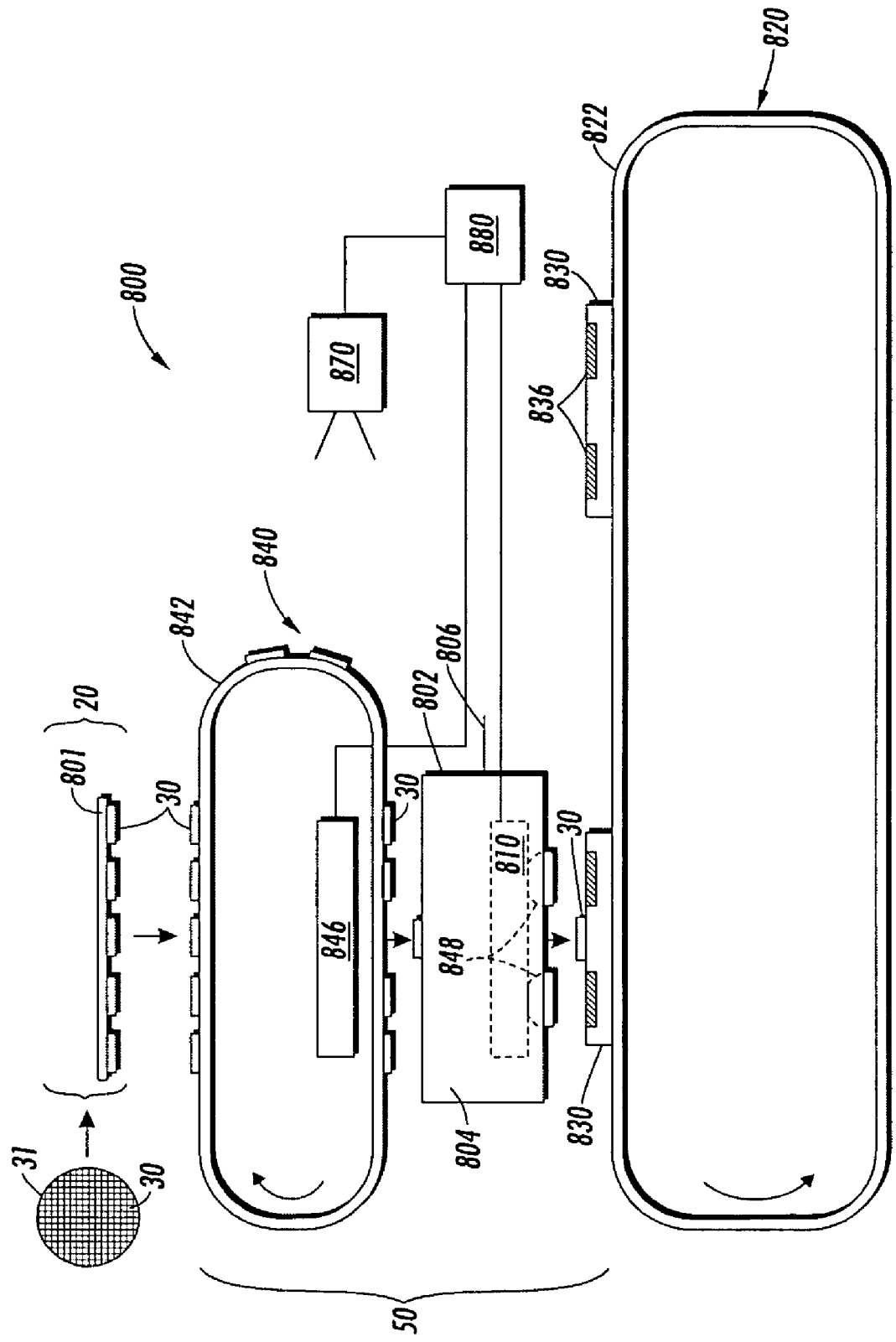
FIG. 13 is a schematic side view of an example embodiment of a pre-sorted micro-assembler of FIG. 12.

FIG. 13 is a more detailed side view of micro-assembler 800 of FIG. 12. Micro-assembler 800 includes a conveyor 802 having an outer surface 804 and an axis of rotation 806. In an example embodiment, conveyor 802 is a drum, while in another example embodiment it is a conveyor belt. Conveyor 802 is adapted to carry micro-objects 30. For example, micro-objects 30 have attached thereto an easily released plastic sheet (e.g., ultraviolet releasable sticky tape) that secures the micro-objects to conveyor outer surface 804.

In an example embodiment, the front side and backside of micro-objects 30 are coated with material that can carry electrostatic charge, either in liquid or in the air by triboelectric charging.

Micro-assembler 800 also includes another conveyor 820 with an outer surface 822. Conveyer 820 runs beneath conveyor 802 in the direction parallel to rotational axis 806, and is arranged so that it can receive micro-objects from conveyor 802. In particular, conveyor 820 carries substrates 830 on outer surface 822, wherein the substrates are adapted to receive micro-objects 30 from conveyor 802 at select locations and orientations. In an example embodiment, substrates 830 include electrical contacts 836, such as pre-patterned metallization and/or bump bonds with respect to which micro-objects 30 are placed and oriented.

In an example embodiment, an optical release device 810 (dashed outline) is arranged within conveyor 802 and is in optical communication with a portion of the conveyor that is adjacent conveyor 820 so that micro-objects 30 held on conveyor outer surface 804 can be optically released and delivered to substrates 830 by the activation of the optical release device.

In an example embodiment, micro-objects 30 are loaded onto to a uniformly charged photoreceptor conveyor 840 having an outer surface 842 and arranged to be in operable communication with conveyor 802, e.g., arranged parallel to conveyor 820 but opposite thereto. Photoreceptor conveyor 840 serves as a micro-object reservoir, wherein the micro-objects 30 are charged and held on outer surface 842 by an electrostatic force. In an example embodiment, micro-objects 30 are provided to conveyor outer surface 842 by removing the micro-objects from releasable-adhesive substrate 801, as shown in FIG. 13.

With continuing reference to FIG. 13, an optical release device 846 (dashed outline) is arranged within conveyor 840 and is in optical communication with a portion of the conveyor that is adjacent conveyor 802 so that micro-objects 30 held on conveyor outer surface 842 can be delivered to conveyor 802 by the activation of optical release device 846.

The advantage of using photoreceptor conveyor 840 is that sorter unit 40 is not needed because the micro-objects are placed thereon and maintained in a predefined order. Also, in an example embodiment, a machine vision system 870 is arranged to be in visual communication with conveyor 840 so as to detect the arrangement of micro-objects 30 thereon as the conveyor brings the micro-objects to conveyor 802. The information obtained by machine vision system 870 is provided to a controller 880 operably coupled to optical release devices 810 and 846 to control the placement of micro-objects 30 on conveyor 802 and onto substrates 830.

In the operation of micro-assembler 800, when the desired micro-object 30 reaches the designated position relative to substrate 830 passing below, light beam 848 is generated by optical release device 810. This serves to discharge the local charge on conveyor 820, or alternatively release the adhesive of a photoreleasable material securing the micro-objects to the conveyor. The desired micro-object 30 is then transferred by either gravity or a uniform electric field to substrate 830. Substrate 830 with micro-objects 30 thereon then proceed to post-processing unit 80 (FIG. 12) to form the final micro-assembly 76, as described above in connection with micro-assembler 100.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction, operation and example embodiments described herein. Accordingly, other embodiments are within the scope of the appended claims.

What is claimed is:

1. A method of forming a micro-assembly, comprising:
    sorting and orienting a plurality of micro-objects;
    providing the sorted and oriented micro-objects to an image transfer unit;
    transferring the sorted and oriented micro-objects from the image transfer unit to a substrate; and
    fixing the transferred micro-objects to the substrate to form a micro-assembly.

2. The method of claim 1, wherein the image transfer unit includes a rotatable drum having an outer surface that supports an electrostatic image, and further including:
    providing a select electrostatic image to the drum outer surface; and
    securing the micro-objects to the outer surface via the select electrostatic image while transferring the micro-objects to the substrate.

3. The method of claim 1, including encoding some or all of the micro-objects with a patterned charge, and wherein said sorting and orienting includes electrically and/or magnetically manipulating the micro-objects based on the charge.

4. The method of claim 3, including sorting the charge-encoded micro-objects by providing a dynamic electrostatic field matched to the encoded charge.

5. The method of claim 1, including:
    forming the micro-objects in a semiconductor wafer; and
    dicing the semiconductor wafer.

6. The method of claim 5, further including forming a charge-encoded pattern on the micro-objects prior to dicing.

7. The method of claim 5, further including forming a charge-encoded pattern by inkjet printing.

8. The method of claim 1, wherein some or all of the micro-objects are selectively charge-encoded, and wherein the sorting includes:
    suspending the micro-objects in a liquid medium; and
    conveying some or all micro-objects from the liquid to the image transfer unit via a dynamic electrostatic field matched to the selectively charge-encoded micro-objects.

9. The method of claim 1, including:
    forming the micro-objects to have an encoded charge;
    subjecting the charge-encoded micro-objects to a dynamic electrostatic field matched to some or all of the charge-encoded micro-objects so as to orient and convey said some or all micro-objects to the image transfer unit.

10. The method of claim 9, including:
    providing the dynamic electrostatic field with a transport field that moves some or all of the micro-objects toward the image transfer unit and; providing the dynamic electrostatic field with an annealing field that randomly fluctuates.

11. The method of claim 10, further including moving the annealing field away from the image transfer unit.

12. The method of claim 10, wherein the transport field and the annealing field have respective strengths, and further including spatially varying the strength of the transport field and the strength of the annealing field to reduce movement of the micro-objects as the micro-objects get closer to the image transfer unit.

13. The method of claim 1, further including after said transferring: electrically connecting two or more of the micro-objects.

14. The method of claim 1, further including charge-encoding the micro-objects by adding charge-encoding elements to microchips formed in a wafer prior to the wafer being diced into the microchips.

15. The method of claim 13, further including after said transferring: removing the charge-encoding elements from the micro-objects.

16. The method of claim 15, further including:
    planarizing the micro-objects and the substrates to expose a portion of corresponding micro-bodies with the micro-objects; and
    operably interconnecting the micro-bodies.

17. The method of claim 1, including providing the micro-objects as sets of different micro-objects with different charge-encoded patterns.

18. A method of forming a micro-assembly, comprising:
    encoding each of one or more micro-objects with a patterned charge that identifies each micro-object and specifies its orientation;
    sorting the charge-encoded micro-objects based on their encoded charge;
    providing the sorted charge-encoded micro-objects to a xerographic imaging unit adapted to receive and carry the sorted charge-encoded micro-objects;
    transferring the sorted charge-encoded micro-objects from the xerographic imaging unit to a substrate; and
    fixing the transferred micro-objects to the substrate to form a micro-assembly.

19. The method of claim 18, including providing an electrostatic image to the xerographic imaging unit to facilitate maintaining said sorting during said transferring.

20. The method of claim 18, including providing the xerographic imaging unit with a conveyor.

21. The method of claim 20, including providing the xerographic imaging unit with a drum adapted to support an electrostatic image.

22. The method of claim 18, including manipulating the micro-objects using a dynamic electrostatic field.

23. The method of claim 22, including manipulating the micro-objects using a magnetic field.

* * * * *